US008653907B2

(12) United States Patent
Mooney et al.

(10) Patent No.: US 8,653,907 B2
(45) Date of Patent: Feb. 18, 2014

(54) RESONATED BYPASS CAPACITOR FOR ENHANCED PERFORMANCE OF A MICROWAVE CIRCUIT

(75) Inventors: Jon Mooney, Dallas, TX (US); David D. Heston, Dallas, TX (US); Claire E. Mooney, Dallas, TX (US); Tiffany E. Cassidy, Nevada, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/185,053

(22) Filed: Jul. 18, 2011

(65) Prior Publication Data

US 2013/0021115 A1    Jan. 24, 2013

(51) Int. Cl.
*H03H 7/01*    (2006.01)
*H03F 3/04*    (2006.01)

(52) U.S. Cl.
USPC .......................................... 333/181; 333/176

(58) Field of Classification Search
USPC .................. 333/181, 172, 176; 330/296, 311
See application file for complete search history.

(56) References Cited

U.S. PATENT DOCUMENTS

| | | | | |
|---|---|---|---|---|
| 5,260,862 | A | * | 11/1993 | Marsh ............................. 363/39 |
| 5,990,747 | A | * | 11/1999 | Chaki et al. ..................... 330/286 |
| 6,177,841 | B1 | * | 1/2001 | Ohta et al. ...................... 330/302 |
| 6,313,705 | B1 | | 11/2001 | Dening et al. |
| 6,528,983 | B1 | | 3/2003 | Augustine |
| 6,636,119 | B2 | * | 10/2003 | Vathulya ........................ 330/311 |
| 6,788,168 | B2 | * | 9/2004 | Guitton et al. ................. 333/170 |
| 6,919,774 | B2 | | 7/2005 | Ritchey et al. |
| 7,812,689 | B2 | * | 10/2010 | Atsumo et al. ................. 333/164 |
| 2011/0080230 | A1 | * | 4/2011 | Fukuda et al. ................. 333/181 |

FOREIGN PATENT DOCUMENTS

| | | |
|---|---|---|
| JP | 2011-082809 A | 4/2011 |
| JP | 2011-088080 A | 5/2011 |
| WO | WO 02/50996 A2 | 6/2002 |

OTHER PUBLICATIONS

Ahmad Khanifar, et al., "Bias circuit Topologies for Minimization of RF Amplifier Memory Effects", European Microwave Conference, 2003, 33rd, IEEE, Piscataway, NJ, USA, Oct. 1, 2003 (pp. 1349-1352).
Extended European Search Report for European Application No. 12168185.2, Applicant: Raytheon Company, extended European Search report dated Oct. 19, 2012 and mailed Oct. 25, 2012 (7 pages).
Office action for corresponding Japan Application No. 2012-113760, filed May 17, 2012, Office action mailed Aug. 6, 2013 (4 pgs.).
English Translation of Japan Office action for corresponding Japan Application No. 2012-113760, filed May 17, 2012, Office action mailed Aug. 6, 2013 (5 pgs.).

* cited by examiner

*Primary Examiner* — Dean O Takaoka
*Assistant Examiner* — Alan Wong
(74) *Attorney, Agent, or Firm* — Christie, Parker & Hale, LLP

(57) ABSTRACT

The present invention relates to microwave circuits, and more particularly to bypass circuits for bias connections. The bypass circuit comprises a capacitor in series with an inductor, the series combination being connected between the bias conductor and ground. This series combination provides low return loss at the operating frequency. A de-queueing circuit may be included in the bypass circuit to provide loss at other frequencies.

9 Claims, 5 Drawing Sheets

RESONATED BYPASS CAPACITOR FOR ENHANCED PERFORMANCE OF A MICROWAVE CIRCUIT

FIELD

The present invention relates to microwave circuits, and more particularly to bypass circuits for a bias connection in a monolithic microwave integrated circuit.

BACKGROUND

A monolithic microwave integrated circuit (MMIC) is an integrated circuit which operates at microwave frequencies. Typically, a MMIC is designed to operate in a band of frequencies centered on a particular operating frequency. A MMIC may have input and output connections for signals at or near the operating frequency, and, in addition, a MMIC may have low-frequency or direct current (DC) connections, known as bias connections. Bias connections may provide power or control signals to the components in the MMIC, or they may provide for the output of low-frequency signals from the MMIC. MMIC amplifiers, for example, require DC power, MMIC modulators require modulation signals, and MMIC detectors may produce low-frequency output signals.

It is generally preferred that the microwave signals at or near the operating frequency not be able to propagate into or out of the MMIC through the bias connections. Otherwise, a microwave signal may propagate out of the MMIC through a bias connection, reflect from components outside of the MMIC, and propagate back into the MMIC, again through a bias connection; such unwanted interactions with circuitry outside the MMIC may lead to ripple in its frequency response, or to oscillations. Because the MMIC designer has limited control over external circuitry that may later be connected to the MMIC, it is desirable to make the operation of the MMIC as nearly as possible independent of such external circuitry. In a MMIC amplifier, efficiency may be a further reason for preventing transmission of microwave signals through bias connections: any net microwave power loss at a bias connection corresponds to power that can not be made available at the circuit's microwave output connection.

Microwaves may be prevented from propagating into or out of the MMIC by providing a microwave short circuit to ground at some point on the bias conductor. Such a short circuit will reflect microwave signals. A sufficiently large capacitor, for example, connected between a bias conductor and ground will approximate a short circuit to ground for microwave signals. Provided the capacitor is not too large, it will also approximate an open circuit at low frequencies, allowing the bias signals to propagate freely into or out of the MMIC.

A large capacitor, however, may occupy a large area in the MMIC. In MMIC design, the physical size of the integrated circuit, or "chip," is often constrained, and a MMIC designer must try to fit the circuit being designed into a small area. The impedance at microwave frequencies of a capacitor is inversely proportional to its area. As a result, a capacitor which occupies a small area on the chip may not provide a sufficiently low impedance at microwave frequencies.

Other characteristics may be desirable in a bypass circuit. Unless proper design precautions are taken, a MMIC amplifier may oscillate at frequencies other than the operating frequency. This may be prevented by providing loss in the microwave signal path, for example by installing a series resistor in the bias conductor. Such a resistor, however, will add loss at all frequencies, including the operating frequency and DC, wasting both DC supply power and microwave power at the operating frequency. It is desirable, therefore, that the bias circuit provide loss primarily at frequencies at which the MMIC amplifier might otherwise oscillate.

Thus, there is a need for a bypass circuit which provides a low impedance at a microwave operating frequency, while consuming a smaller amount of chip area than a capacitor with a similar impedance at the same frequency. Further, there is a need for a bypass circuit capable of providing significant loss at microwave frequencies different from the operating frequency.

SUMMARY

Embodiments of the present invention provide a bypass circuit to be connected to a bias conductor in a MMIC or other microwave circuit. One aspect of embodiments of the present invention allows bias currents to flow substantially without loss in the bias conductor while reflecting microwave signals at the operating frequency with low return loss. A further aspect of embodiments of the present invention provides loss at frequencies between DC and the operating frequency, to prevent a MMIC amplifier circuit from oscillating.

In one embodiment, a bypass circuit comprises a capacitor connected in series with an inductor, which in turn is connected to ground, wherein the resonant frequency of the combination of the capacitor and inductor is the operating frequency of the microwave circuit. Another embodiment further comprises a parallel circuit comprising a resistor, a second capacitor, and a second inductor, wherein the resonant frequency of the combination of the second capacitor and the second inductor is below the operating frequency.

DETAILED DESCRIPTION

The detailed description set forth below in connection with the appended drawings is intended as a description of the presently preferred embodiments of a bypass circuit provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

The term "microwave" is used herein, for brevity, to include radio frequencies and millimeter wave frequencies, i.e., to include a frequency range spanning from approximately 1 megahertz (MHz) to 1000 gigahertz (GHz).

Figure 1:
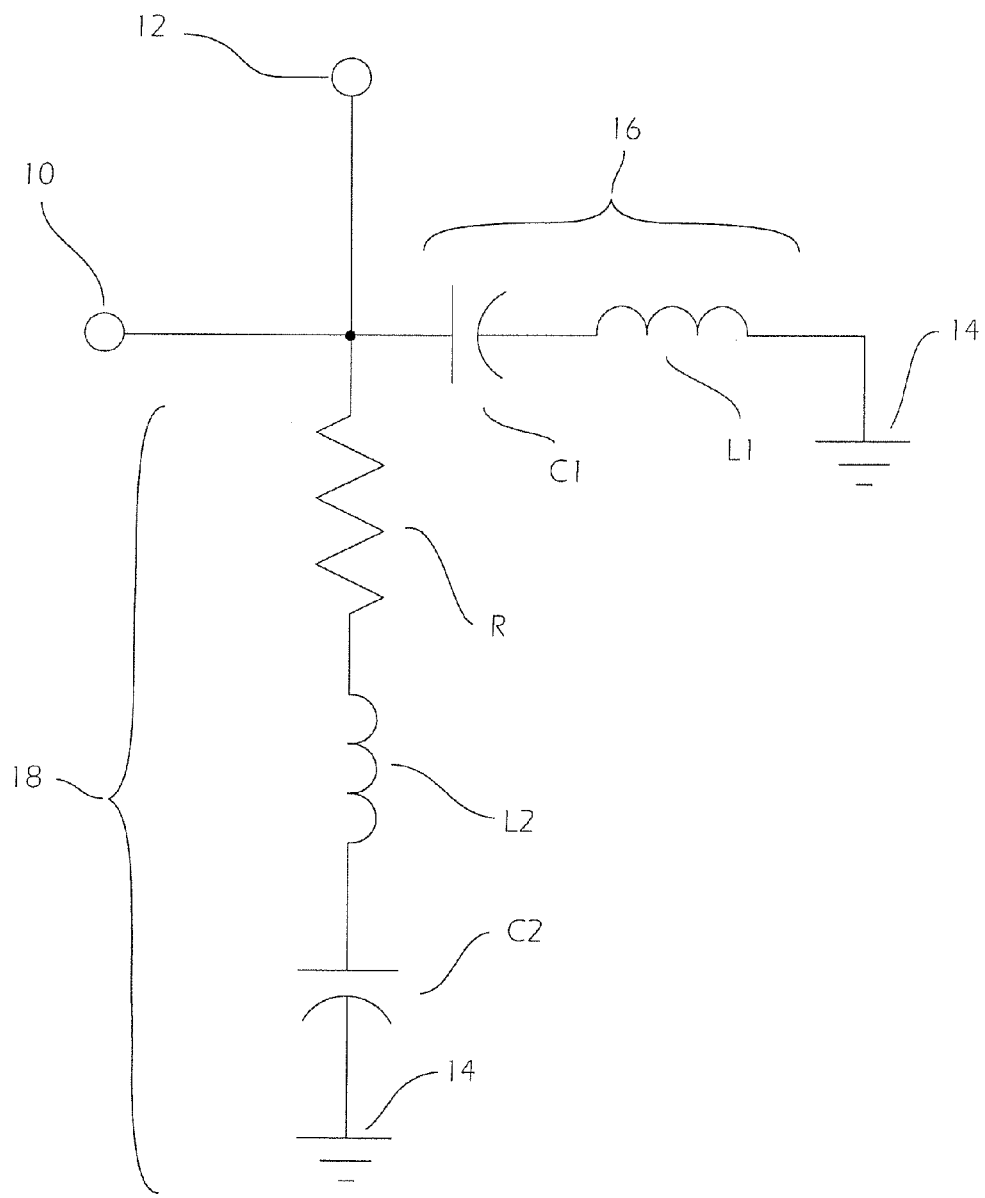
FIG. 1 is a schematic diagram of the bypass circuit according to an embodiment of the invention.

Referring to FIG. 1, in the embodiment shown, the bypass circuit provides two connection points: a bond pad connection 12 for connecting the bypass circuit to a bond pad, which provides a connection to external circuitry, and an internal connection 10 for connecting the bypass circuit to the internal circuitry in the MMIC.

The bypass circuit further comprises a resonated bypass capacitor 16 and a de-queueing circuit 18. The resonated bypass capacitor 16 is the series combination of capacitor C1 and inductor L1, connected to a ground connection 14, with the values C1 and L1 chosen so that the circuit is resonant at the operating frequency.

At the resonant frequency, the impedance of the resonated bypass capacitor 16 is low. The impedance of the series combination of an ideal capacitor with capacitance C and an ideal inductor with inductance L is zero at the resonant frequency $f_0$, which is given by $f_0=(1/LC)^{1/2}/(2\pi)$. Similarly, the resonant impedance of a real capacitor connected in series with a real inductor is low, differing from zero only to the extent that the real components differ from their ideal counterparts. The impedance of the resonated bypass capacitor 16 formed by C1 and L1 may be made low, in one embodiment, at an operating frequency of 10 GHz, by using values for C1 and L1 of approximately 4 picofarads (pF) and 0.063 nanohenrys (nH), respectively. In particular, the impedance may be lower than that of a capacitor occupying the same area as capacitor C1 and inductor L1.

In the embodiment of FIG. 1, the de-queueing circuit 18 is the series combination of resistor R, capacitor C2, and inductor L2, connected to a ground connection 14. The de-queueing circuit 18 is connected in parallel with the resonated bypass capacitor 16. At the operating frequency, the impedance of the resonated bypass capacitor 16 is low, and the de-queueing circuit 18 has little effect, but at other frequencies the de-queueing circuit 18 provides a frequency-dependent impedance, which may be used to suppress oscillations in a MMIC containing an amplifier.

In an exemplary embodiment, the values of C2 and L2 may be chosen so that their resonant frequency is significantly lower than the operating frequency. At this resonant frequency the impedances of inductor L2 and capacitor C2 substantially cancel, leaving the resistance of resistor R as the impedance of the de-queueing circuit 18.

In the frequency interval between the resonant frequency of the de-queueing circuit 18 and that of the resonated bypass capacitor 16, the resonated bypass capacitor 16 will have an impedance which is primarily capacitive and the de-queueing circuit 18 will have an impedance which is resistive and inductive. At some intermediate frequency these two impedances, one capacitive and the other inductive and resistive, will form a parallel resonant circuit with a relatively high impedance. This resonant mode, and the series resonance involving capacitor C2 and inductor L2, make it possible for the impedance of the de-queueing circuit 18, and that of the bypass circuit, to change rapidly as a function of frequency, and to provide significant loss at intermediate frequencies while providing low loss at the operating frequency and at DC. The de-queueing circuit 18 of this embodiment does not introduce loss at DC, where it acts as an open circuit because of the series capacitor C2, nor at the operating frequency, because it is connected in parallel with the resonated bypass capacitor 16, which provides a near-short-circuit to ground at the operating frequency. The selection of component values for the resistor R, the capacitor C2 and inductor L2 may be accomplished using an iterative tuning process described in greater detail below.

Figure 2:
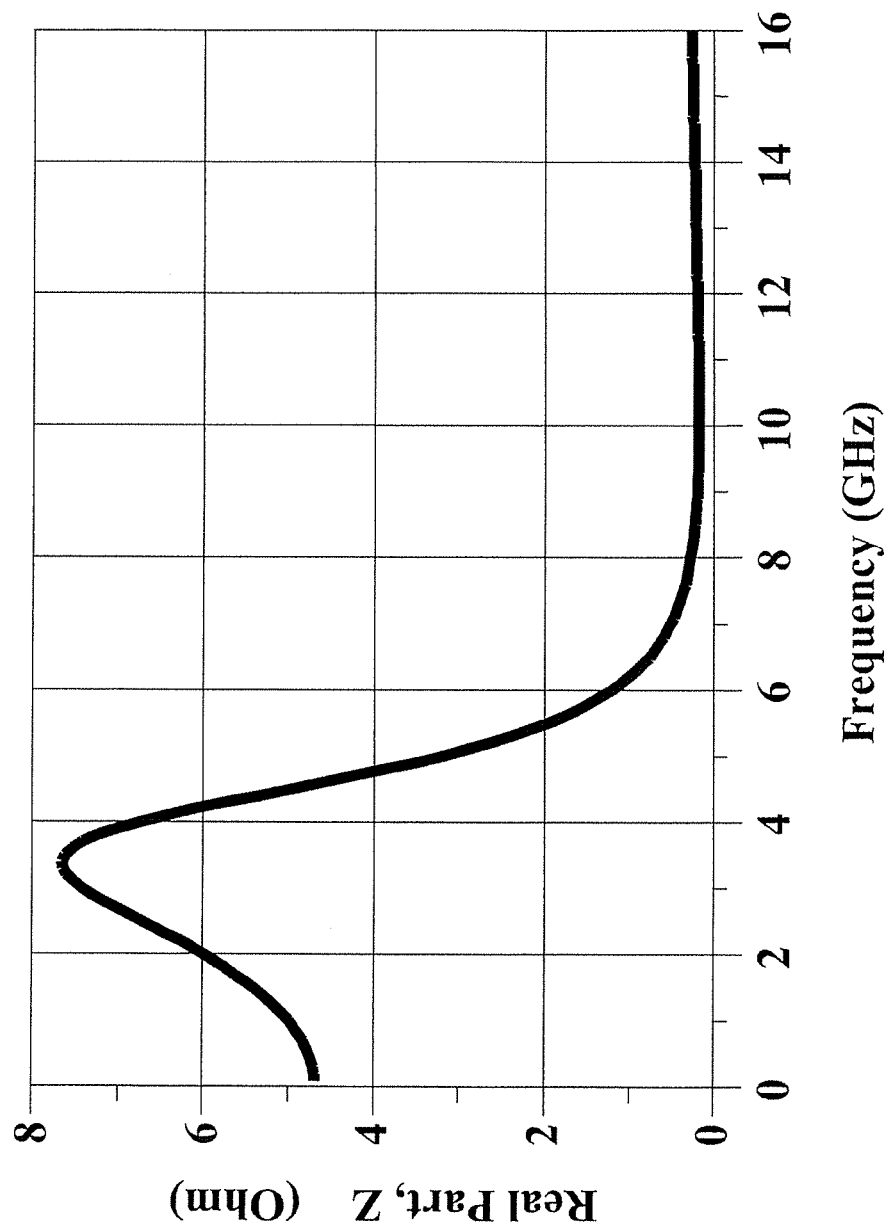
FIG. 2 is a plot of the real part of the impedance, as a function of frequency, of an embodiment of the bypass circuit.

Referring to FIG. 2, which shows an exemplary plot of the real part of the impedance of an embodiment of the bypass circuit, the real part of the impedance may be low at an operating frequency of 10 GHz, and considerably higher at lower frequencies.

The de-queueing circuit 18 of the embodiment illustrated in FIG. 1 consists of a series resistor-inductor-capacitor (RLC) combination, but the invention is not limited to this embodiment. As used herein, the term "de-queueing circuit" means an arbitrary combination of components which provides a high impedance at DC, connected between the bias connection and ground. The de-queueing circuit may, for example, include an additional RLC combination, connected in parallel to the first, or it may comprise other circuit elements, such as open transmission line stubs, in addition to, or instead of, the circuit elements shown in the embodiment of FIG. 1. In this manner the impedance to ground of the bias circuit may be tailored to any of a wide range of functions of frequency, provided sufficient MMIC chip area is available to form the required components.

Figure 3A:
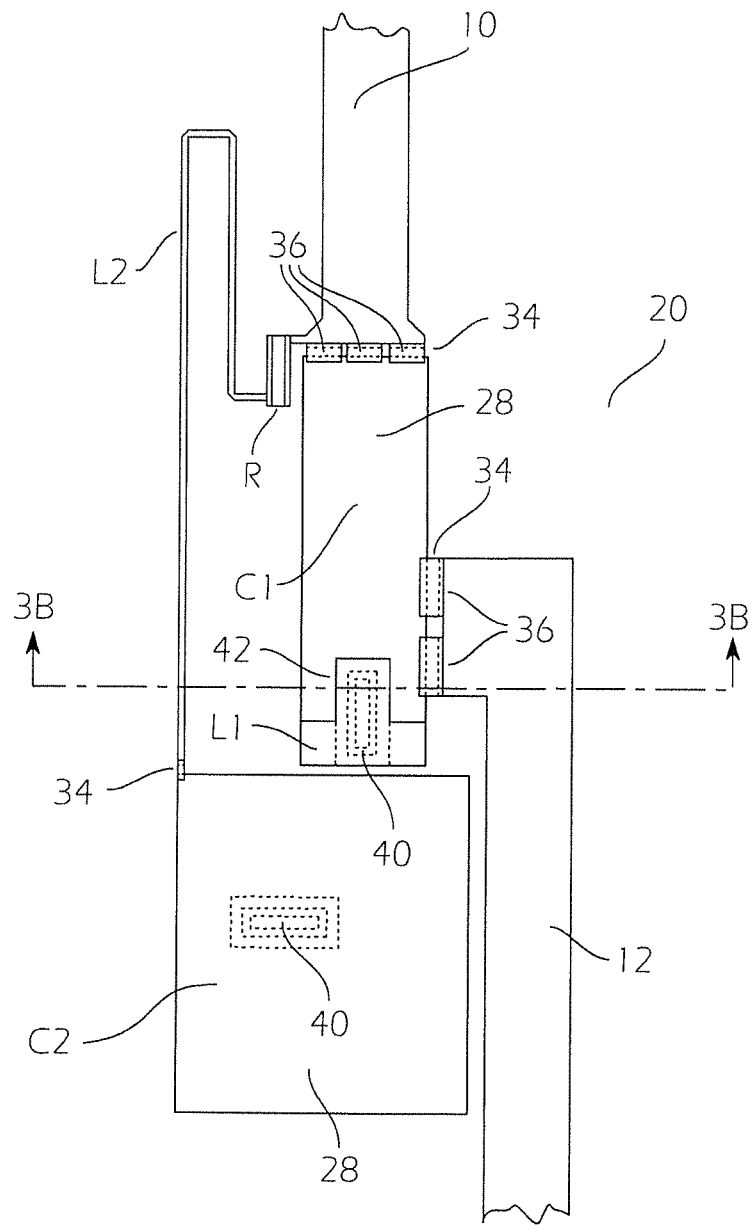
FIG. 3A is a fragmentary plan view of components fabricated on a MMIC substrate to implement the circuit of FIG. 1 according to an embodiment of the invention.
Figure 3B:
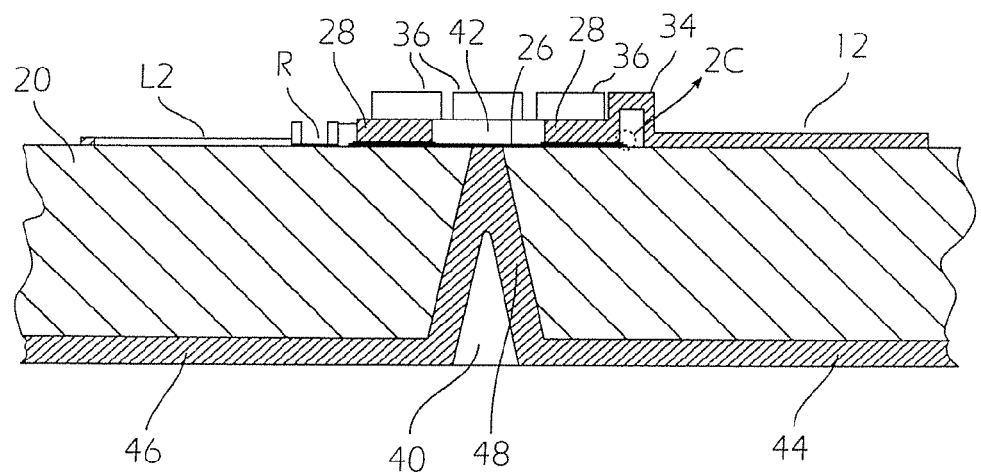
FIG. 3B is an enlarged fragmentary cross-sectional view taken along the section line 3B-3B of FIG. 3A.
Figure 3C:
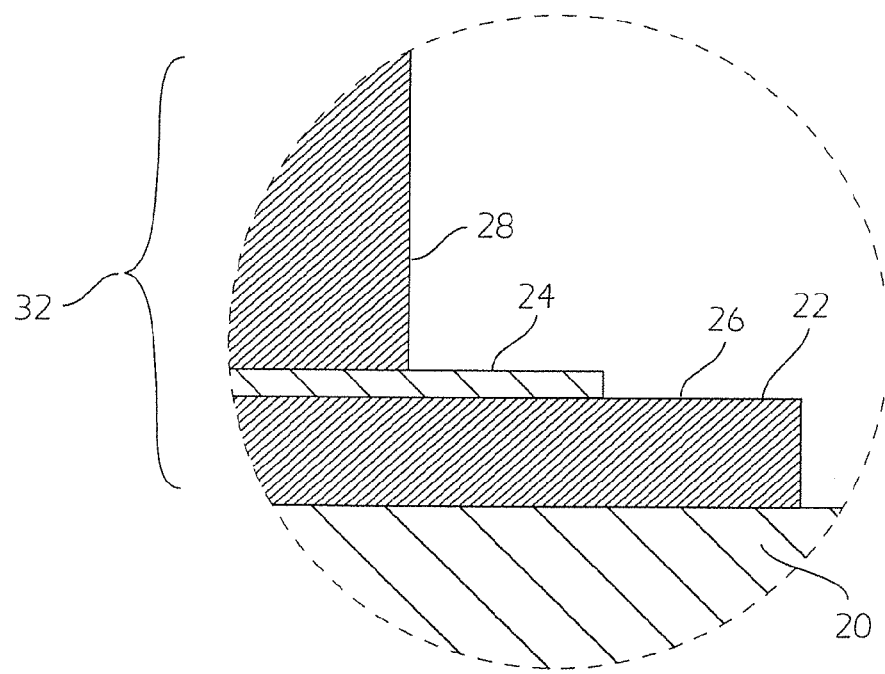
FIG. 3C is an enlarged cross-sectional view taken along line 2C of FIG. 3B.
Figure 4:
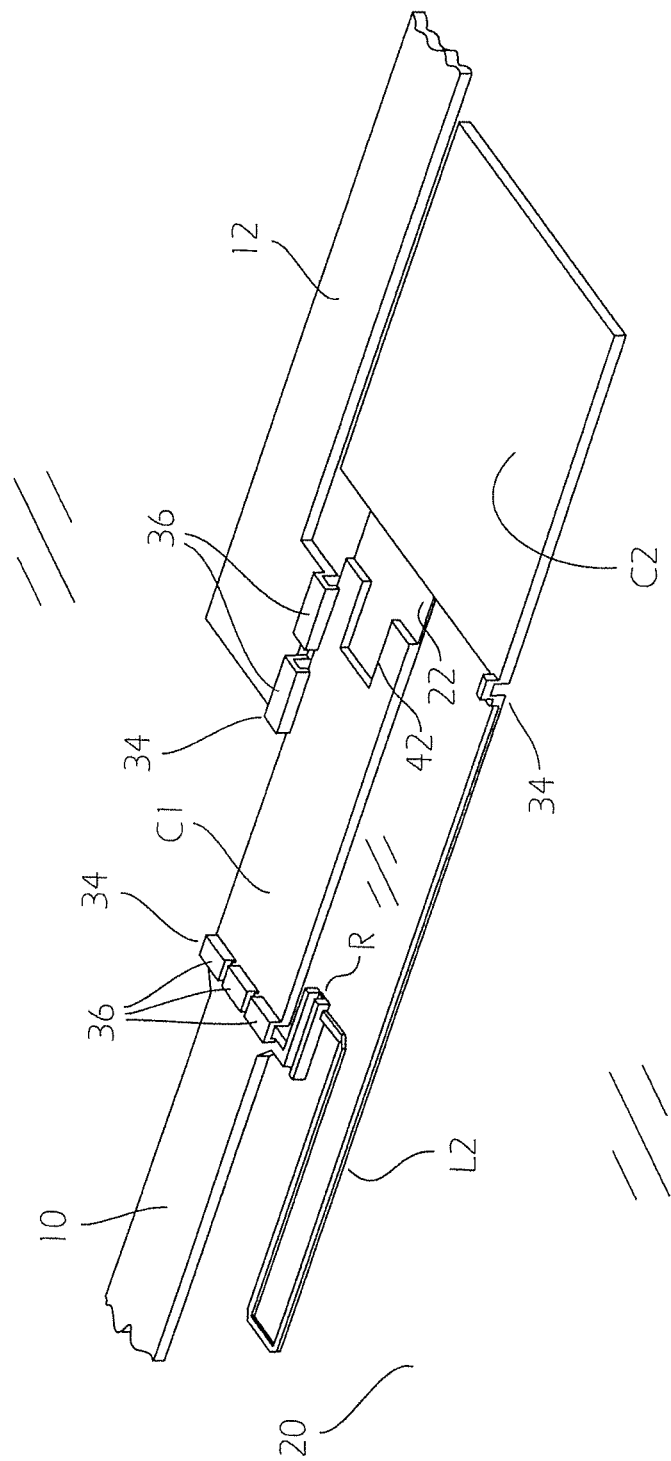
FIG. 4 is a fragmentary perspective view of the embodiment of FIG. 3A.

Referring to FIG. 3A and FIG. 4, in an exemplary embodiment the capacitors C1 and C2 may be fabricated on a MMIC as substantially rectangular metal-insulator-metal capacitors, or MIM capacitors. Referring to FIG. 3C, a MIM capacitor 32 may be formed by depositing a first layer of metal 22 on the MMIC substrate 20, to form the bottom plate 26 of the MIM capacitor 32, then depositing a dielectric material such as silicon nitride (SiN), on top of the first layer of metal 22 to form what is known as the nitride layer 24, and finally depositing one or more additional layers of metal on the nitride layer 24 to form the top plate 28 of the MIM capacitor 32. The nitride layer 24 is preferably made thin, with a thickness of 0.2 microns, for example, to increase the capacitance per unit area, but sufficiently thick that the MIM capacitor 32 will reliably withstand the highest voltage to which it will be exposed. The first layer of metal 22, forming the bottom plate 26 of the MIM capacitor 32 may be 0.77 microns thick. The nitride layer 24 and the bottom plate 26 are too thin to be clearly discernable in FIG. 3A, FIG. 3B, and FIG. 4, but they are visible in the enlarged cross sectional view of FIG. 3C.

Referring to FIG. 3B, the top plate 28 may have a total thickness of 6 microns, deposited in two metal deposition steps, with 2 microns of metal deposited first and an additional 4 microns of metal deposited subsequently. The need for a conductor to carry the bias current may dictate the thickness of metal required. In this embodiment, for example, the bias current path traverses the top plate 28 of capacitor C1, and the top plate 28 may therefore require a certain minimum thickness.

Referring to FIGS. 3A and 3B, a connection to the bottom plate 26 of a MIM capacitor 32 may be formed using a ground via 40 through the substrate 20. The ground via 40 may be formed by first using a wet etch process to form a tapered hole through the substrate 20, and then plating the entire back side of the substrate 20 with a back side metal layer 46, which may be 6 microns thick. The back side metal layer 46 forms the back side ground plane 44 and also covers the sloping walls 48 of the ground via 40, forming a conductive path from the back side ground plane 44 to the top of the ground via 40. The bottom plate 26 of a MIM capacitor 32 formed over, or adjacent to, a ground via 40 may then be grounded as a result of being in contact with the upper end of the ground via 40.

The structure shown in the exemplary embodiment illustrated in FIGS. 3A-3C and FIG. 4 may be fabricated in any MMIC foundry having a process capable of forming MIM capacitors and conductive vias. Such a foundry may require that the design being fabricated comply with certain design rules to ensure reliable fabrication. Any semiconductor materials suitable for MMIC fabrication in such a process may be used, including, for example, silicon, gallium nitride, silicon germanium, gallium arsenide, indium phosphide, and gallium nitride. Although the dielectric layer in the embodiment described above is made of silicon nitride, it may in other embodiments be made of any other suitable dielectric.

Referring to FIG. 3C, in a MIM capacitor 32 the nitride layer 24 may be inset with respect to the bottom plate 26, viz. the area of the dielectric layer may be somewhat smaller than that of the bottom plate 26. In this case the top plate 28 must in turn have a somewhat smaller area than the nitride layer 24 to avoid shorting against the bottom plate 26. Referring to FIG. 3B, an air bridge 34 may be used to form a connection to the top plate 28 of the MIM capacitor 32, without shorting to the bottom plate 26. The air bridge 34 may be formed in one embodiment as follows. A 2 micron layer of metal, which is formed in the first of two metal deposition steps used to form the top plate 28, may be deposited on the nitride layer 24. A narrow strip of photoresist may then be deposited adjacent this 2 micron layer of metal, and a 4 micron layer of metal may then be deposited over the 2 micron layer of metal and over the strip of photoresist. Finally the temporary strip of photoresist may be removed by dissolving it out from under the 4 micron layer of metal. The result is a conductive air bridge 34 between the top plate 28 and an adjacent conductor, as shown in cross section in FIG. 3B. Foundry design rules may require that wide air bridges 34 be aimed from multiple narrower air bridge sections 36.

Referring to FIGS. 3A-3C, when the bottom plate 26 of a MIM capacitor 32 is grounded, the ground via 40 used to accomplish this is customarily placed near the center of the capacitor. This provides a short path to ground from the capacitor bottom plate 26. FIG. 3A illustrates such a ground via 40 positioned approximately under the center of capacitor C2. In an exemplary embodiment the inductance L1 may be formed by placing the ground via 40 for the capacitor C1 at some distance from the center of the capacitor C1, so that current flowing to ground from the bottom plate 26 takes a longer path than it would if the ground via 40 for capacitor C1 were centered. The effect of this offset is that the bottom plate 26 of capacitor C1 is connected not directly to ground but to a grounded transmission line stub. This grounded stub may act as an inductive shunt to ground at the operating frequency. Both the length and the width of the conductive path from the bottom plate 26 of the capacitor C1 to the ground via 40 affect the inductance of inductor L1. In one embodiment the bottom plate 26 of capacitor C1 is extended, at constant width, over the ground via 40, and the offset between the center of the capacitor C1 and its ground via 40 is substantially 100 microns.

Referring to FIG. 4, foundry design rules may require that the nitride layer 24 and top plate 28 of the capacitor C1 have a rectangular cutout 42 so as to provide a minimum clearance between these layers and the top of the ground via 40. In one embodiment the top plate 28 of capacitor C1 may have outer dimensions of 210 microns by 72 microns, with a rectangular cutout 42 with a length of 36 microns, parallel to the longer dimension of the capacitor C1, and a width of 30 microns.

Inductor L2 may also be formed as a section of microstrip transmission line. The inductance of the inductor L2 is then determined by the length and width of this transmission line, which in one embodiment may be 575 microns and 5 microns, respectively. The resistor R may be fabricated as a 7.5 ohm thin-film resistor.

Adjustments to the locations and dimensions of the components in the bypass circuit may be made using a tuning process to provide the desired impedance, as a function of frequency, at the internal connection 10. These adjustments may be made using electromagnetic field simulation software such as the Agilent Advanced Design System, sold by Agilent Technologies of Santa Clara, Calif. Using such software, a designer may, for example, plot, as a function of frequency, the amplitude and the phase of the reflection from the internal connection 10, and then iteratively make adjustments to the components in the circuit until acceptable characteristics are achieved. During this process the designer may strive to achieve low return loss at the operating frequency, high impedance to ground at DC, and high return loss at other frequencies. The designer also may seek to adjust the phase of the reflected wave as a function of frequency. When a system design employing the present invention has been adjusted for good performance for one set of frequencies, and it is desired to use the system with a different set of frequencies, it may be necessary to repeat the tuning process for the new frequencies.

Although limited embodiments of a MMIC bypass circuit have been specifically described and illustrated herein, many modifications and variations will be apparent to those skilled in the art. Accordingly, it is to be understood that the bypass circuit constructed according to principles of this invention may be embodied other than as specifically described herein. The invention is also defined in the following claims.

What is claimed is:

1. In a monolithic microwave integrated circuit (MMIC) having a substrate, a bypass circuit for providing, at a bias connection, an impedance to ground of substantially zero at an operating frequency, the bypass circuit comprising:
   a first on-chip capacitor,
   a first on-chip inductor,
   wherein
      the inductor is connected between the capacitor and ground, the connection to ground being made through the substrate by a ground via, and
      the capacitor is connected between the bias connection and the inductor, and
   a de-queueing circuit configured to introduce loss over a frequency range extending below the operating frequency.

2. The bypass circuit of claim 1 wherein the first inductor is formed by providing a conductive path to ground of predetermined length and width.

3. The bypass circuit of claim 1, wherein the de-queueing circuit comprises:
   a resistor,
   a second capacitor, an
   a second inductor,
   wherein the resistor, the second capacitor, and the second inductor are connected in series, between the bias connection and ground.

4. The bypass circuit of claim 3, wherein the combination of the second capacitor and the second inductor is resonant at a frequency lower than the operating frequency.

5. The bypass circuit of claim 3, wherein the first and second capacitors are metal-insulator-metal (MIM) capacitors fabricated in a monolithic microwave integrated circuit (MMIC) process.

6. The bypass circuit of claim 3, wherein the second inductor is formed as a conductive path of predetermined length and width.

7. A method of forming a bypass circuit at a bias connection on a monolithic microwave integrated circuit (MMIC) having a substrate, the method comprising:
    providing a first capacitor on the MMIC, connected to the bias connection,
    providing a first inductor on the MMIC, connected between the first capacitor and ground, the first inductor being connected to ground through the substrate by a ground via, and
    providing a de-queueing circuit, configured to introduce loss over a frequency range extending below an operating frequency, connected between the bias connection and ground.

8. The method of claim 7, wherein the step of providing a de-queueing circuit comprises the steps of
    providing a resistor, connected to the bias connection,
    providing a second inductor, connected to the resistor, and
    providing a second capacitor, connected between the second inductor and ground.

9. The method of claim 7, wherein the step of providing the first capacitor connected to the bias connection comprises the steps of
    forming a first layer of metal on the MMIC substrate,
    forming a layer of dielectric on the first layer of metal,
    forming a second layer of metal on the dielectric, and
forming an air bridge across a portion of the first layer of metal between the bias connection and the second layer of metal.

* * * * *